(12) United States Patent
Lee et al.

(10) Patent No.: US 10,957,756 B2
(45) Date of Patent: Mar. 23, 2021

(54) DISPLAY DEVICE

(71) Applicant: SAMSUNG DISPLAY CO., LTD., Yongin-si (KR)

(72) Inventors: Wang Woo Lee, Yongin-si (KR); Moo Soon Ko, Yongin-si (KR); Hyeon Sik Kim, Yongin-si (KR); Young Woo Park, Yongin-si (KR); Se Wan Son, Yongin-si (KR); Jin Sung An, Yongin-si (KR); Min Woo Woo, Yongin-si (KR); Seong Jun Lee, Yongin-si (KR); Jeong Soo Lee, Yongin-si (KR); Ji Seon Lee, Yongin-si (KR); Deuk Myung Ji, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/367,589

(22) Filed: Mar. 28, 2019

(65) Prior Publication Data
US 2020/0058723 A1 Feb. 20, 2020

(30) Foreign Application Priority Data
Aug. 17, 2018 (KR) .................. 10-2018-0095944

(51) Int. Cl.
*H01L 27/32* (2006.01)
*H01L 27/12* (2006.01)
*G09G 3/3225* (2016.01)

(52) U.S. Cl.
CPC ...... *H01L 27/3262* (2013.01); *H01L 27/3248* (2013.01); *H01L 27/3258* (2013.01); *H01L 27/3265* (2013.01); *H01L 27/3276* (2013.01); *G09G 3/3225* (2013.01); *G09G 2300/0426* (2013.01); *H01L 27/124* (2013.01);
(Continued)

(58) Field of Classification Search
CPC ... H01L 27/07; H01L 27/124; H01L 27/1248; H01L 27/1255; H01L 27/3248; H01L 27/3258; H01L 27/3262; H01L 27/3265; H01L 27/3276
See application file for complete search history.

(56) References Cited

U.S. PATENT DOCUMENTS 8,711,138 B2 4/2014 Kawabe
2008/0203454 A1* 8/2008 Asami .................. H01L 27/105
257/298

(Continued)

FOREIGN PATENT DOCUMENTS

KR 10-2015-0074825 A 7/2015
KR 10-2016-0137842 A 12/2016
(Continued)

*Primary Examiner* — Cheung Lee
(74) *Attorney, Agent, or Firm* — Kile Park Reed & Houtteman PLLC

(57) ABSTRACT

A display device includes a substrate, a semiconductor layer on the substrate, a first insulating layer on the semiconductor layer, a first conductive layer on the semiconductor layer, a second insulating layer on the first conductive layer, a first contact hole penetrating the first insulating layer and the second insulating layer, a second conductive layer on the second insulating layer, connected to the semiconductor layer through the first contact hole, and including a hydrogen barrier material, and a third insulating layer on the second conductive layer.

20 Claims, 10 Drawing Sheets

(52) U.S. Cl.
 CPC ...... *H01L 27/1248* (2013.01); *H01L 27/1255* (2013.01); *H01L 2227/323* (2013.01)

(56) References Cited

U.S. PATENT DOCUMENTS

| | | | | |
|---|---|---|---|---|
| 2014/0138678 | A1* | 5/2014 | Ito | H01L 29/7869 |
| | | | | 257/43 |
| 2015/0029429 | A1* | 1/2015 | Choi | G02F 1/1368 |
| | | | | 349/43 |
| 2017/0338252 | A1* | 11/2017 | Lee | H01L 29/78633 |

FOREIGN PATENT DOCUMENTS

| | | |
|---|---|---|
| KR | 10-2017-0037792 A | 4/2017 |
| KR | 10-2017-0061776 A | 6/2017 |

\* cited by examiner

DISPLAY DEVICE

CROSS-REFERENCE TO RELATED APPLICATION

Korean Patent Application No. 10-2018-0095944, filed on Aug. 17, 2018, in the Korean Intellectual Property Office, and entitled: "Display Device," is incorporated by reference herein in its entirety.

BACKGROUND

1. Field

Embodiments relate to a display device.

2. Description of the Related Art

The importance of a display device has increased with the development of multimedia. Accordingly, various types of display devices such as a liquid crystal display (LCD) and an organic light emitting display (OLED) have been used. Among them, an organic light emitting display device displays an image by using an organic light emitting element which generates light by recombination of electrons and holes.

SUMMARY

Embodiments are directed to a display device that includes a substrate, a semiconductor layer on the substrate, a first insulating layer on the semiconductor layer, a first conductive layer on the semiconductor layer, a second insulating layer on the first conductive layer, a first contact hole penetrating the first insulating layer and the second insulating layer, a second conductive layer on the second insulating layer, connected to the semiconductor layer through the first contact hole, and including a hydrogen barrier material, and a third insulating layer on the second conductive layer.

Embodiments are also directed to a display device including a substrate, a semiconductor layer on the substrate, a first insulating layer on the semiconductor layer, a first conductive layer on the semiconductor layer, a second insulating layer on the first conductive layer, a first contact hole penetrating the first insulating layer and the second insulating layer to expose the semiconductor layer, a second conductive layer on the second insulating layer and connected to the semiconductor layer through the first contact hole, a third insulating layer on the second conductive layer, a second contact hole penetrating the third insulating layer to expose the second conductive layer and overlapping the first contact hole, and a third conductive layer on the third insulating layer and connected to the second conductive layer through the second contact hole.

BRIEF DESCRIPTION OF THE DRAWINGS

Features will become apparent to those of skill in the art by describing in detail example embodiments with reference to the attached drawings in which.

DETAILED DESCRIPTION

Figure 1:
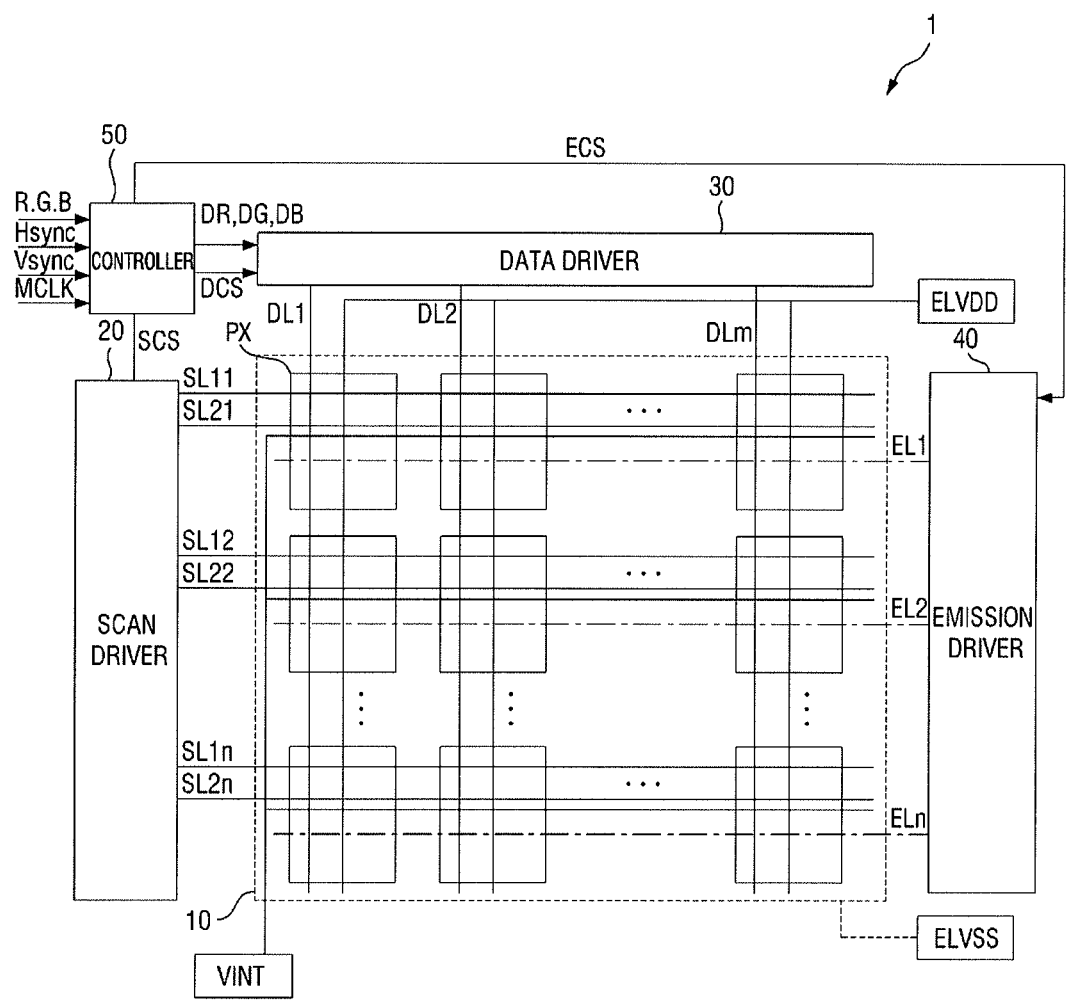
FIG. 1 illustrates a block diagram of a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, example embodiments will be described with reference to the attached drawings.

FIG. 1 is a block diagram of a display device according to an example embodiment.

Referring to FIG. 1, according to an example embodiment, a display device 1 includes a display unit 10 including pixels PX (or reference pixels and unit pixels), a scan driver 20, a data driver 30, a light emission control driver 40, and a controller 50.

The display device 1 (or the display unit 10) may include scan lines SL11 to SL1n and SL21 to SL2n (n is an integer of 2 or more), data lines DL1 to DLm (m is an integer of 2 or more), and light emission control lines EL1 to ELn. The pixels PX may be arranged in intersection areas of the scan lines SL11 to SL1n and SL21 to SL2n, the data lines DL1~DLm, and the light emission control lines EL1 to ELn. The pixel PX may be a display unit of a minimum unit for displaying an image or a color. The pixel PX will be described below with reference to FIG. 2.

The scan lines SL11 to SL1n and SL21 to SL2n may extend substantially in a row direction (or a first direction, between left and right sides). The light emission control lines EL1 to ELn may extend substantially in the row direction. The data lines DL1 to DLm may extend substantially in a column direction (or a second direction, between upper and lower sides). The row direction and the column direction may be switched to each other.

The display device 1 may include initialization voltage wirings (or initialization voltage supply lines), first power supply voltage wirings (or first power voltage supply lines), and second power supply voltage wirings (or second power voltage supply lines).

The initialization voltage wirings may supply an initialization voltage VINIT, and may branched for each row and extend in the row direction. The first power supply voltage wirings are wirings supplying a first power supply voltage ELVDD, and may be branched for each column and extend in the column direction. The second power supply voltage wirings are wirings supplying a second power supply voltage ELVSS different from the first power supply voltage ELVDD, and may be arranged in a mesh form. In another example embodiment, the extending direction of the initialization voltage wiring and the extending direction of the first power supply voltage wiring may be variously modified.

The pixel PX may be connected to two scan lines, one data line, one light emission control line, one initialization voltage wiring, and one first power supply voltage wiring. For example, the pixel PX located at the first row (or first pixel row) and the first column (or first pixel column) (hereinafter, referred to as a 11th pixel) may be connected to 11th and 21st scan lines SL11 and SL21, the first data line DL1, the first light emission control line EL1, one initialization voltage wiring, and one first power supply voltage wiring.

The scan driver 20 may generate first and second scan signals, and may provide the first and second scan signals to the pixels PX through the scan lines SL11 to SL1n and SL21 to SL2n. The first and second scan signals will be described below with reference to FIG. 2.

The data driver 30 may provide data signals to the pixels PX through the data lines DL1 to DLm. For example, when the first scan signal is provided to the pixel PX of the first row and the first column (e.g., the 11th pixel), the data signal may be provided to the 11th pixel.

The light emission control driver 40 generates light emission control signals, and transmits the light emission control signals to the pixel PX through the light emission control lines EL1 to ELn. The light emission control driver 40 (or the display device 1) controls the light emission time of the pixel PX on the basis of the light emission control signals. Although it is shown in the drawing that the light emission control driver 40 is separately implemented independently of the scan driver 20, the light emission control driver 40 may be included in the scan driver 20 and integrated with the scan driver 20. As another example, the light emission control driver 40 may be omitted depending on the circuit configuration of the pixel PX.

The controller 50 may convert video signals R, G and B transmitted from the outside (or an external device such as an application processor) into video data signals DR, DG and DB, and may transmit these video data signals DR, DG and DB to the data driver 30. The controller 50 may receive a vertical synchronization signal Vsync, a horizontal synchronization signal Hsync, and a clock signal MCLK, may generate control signals for controlling the operation (or driving) of the scan driver 20, the data driver 30, and the light emission control driver 40, and may provide the control signals to the scan driver 20, the data driver 30, and the light emission control driver 40, respectively. The control signals may include a scan driving control signal SCS for controlling the scan driver 20, a data driving control signal DCS for controlling the data driver 30, and a light emission driving control signal ECS for controlling the light emission control driver 40.

The display device 1 may include a power supply unit. The power supply unit may generate a first power supply voltage ELVDD, a second power supply voltage ELVSS, and an initialization voltage VINIT, and may provide the first power supply voltage ELVDD, the second power supply voltage ELVSS, and the initialization voltage VINIT to the pixel PX through the first power supply voltage wiring, the second power supply voltage wiring, and the initialization voltage wiring, respectively. The first power supply voltage ELVDD may be a predetermined high-level voltage, the second power supply voltage ELVSS may be a predetermined low-level voltage, and the voltage level of the second power supply voltage ELVSS may be lower than the voltage level of the first power supply voltage ELVDD. The power supply unit may be implemented as an external voltage source.

The pixel PX may emit light of a predetermined luminance on the basis of a driving current supplied to an organic light emitting element in response to data signals transmitted through the data lines DL1 to DLm.

Figure 2:
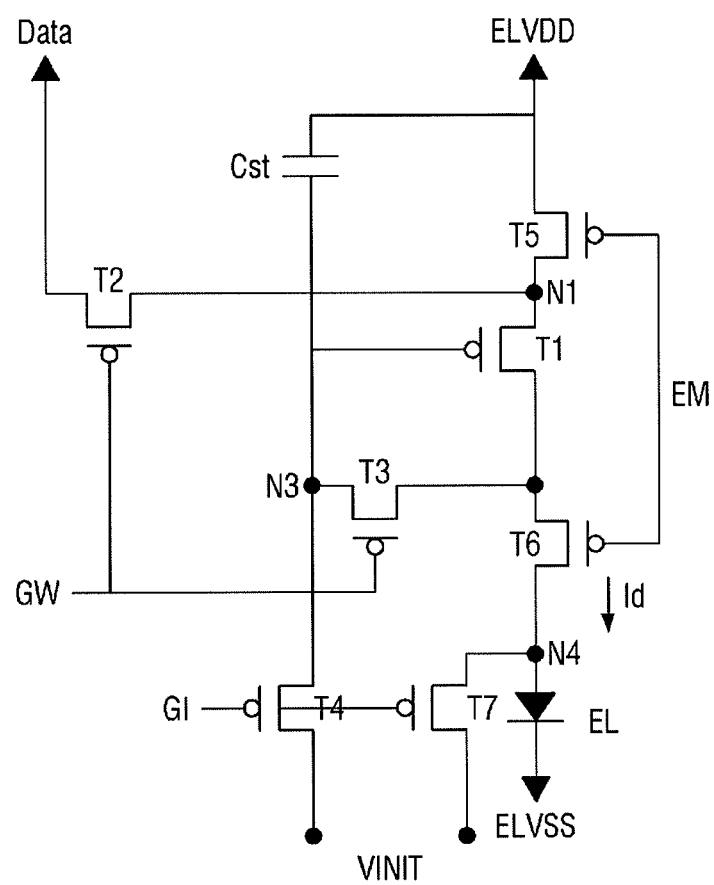
FIG. 2 illustrates a circuit diagram showing an example of a pixel included in the display device of FIG. 1.

FIG. 2 is a circuit diagram showing an example of a pixel included in the display device of FIG. 1.

Referring to FIG. 2, the pixel PX includes a light emitting element (or an organic light emitting diode OLED), first to seventh transistors T1 to T7, and a capacitor Cst. A data signal DATA, a first scan signal GW, and a second scan signal GI may be provided to the pixel PX. The second scan signal GI may be the same as the previous first scan signal GW or the first scan signal GW of the previous row. For example, the second scan signal GI[n] provided to the pixel PX of the n-th row may be the same as the first scan signal GW[n−1] provided to the pixel PX of the (n−1)th row.

Each of the first to seventh transistors T1 to T7 may include a first electrode, a second electrode, and a gate electrode. One of the first electrode and the second electrode may be a source electrode, and the other one thereof may be a drain electrode.

Each of the first to seventh transistors T1 to T7 may be a thin film transistor. Each of the first to seventh transistors T1 to T7 may be any one of a PMOS and an NMOS transistor. Hereinafter, it is assumed that the first to seventh transistors T1 to T7 are PMOS transistors.

The light emitting element EL may include a pixel electrode and a cathode electrode. The pixel electrode of the light emitting element EL may be connected to a fourth node N4, and the cathode electrode thereof may be connected to the second power supply voltage wiring (that is, the wiring for transmitting the second power supply voltage ELVSS).

The first transistor T1 (or driving transistor) may includes a first electrode connected to a first node N1, a second electrode N2 connected to a second node, and a gate electrode connected to a third node N3. The first transistor T1 may provide a driving current Id to the light emitting element EL on the basis of a voltage of the third node N3 (or a data voltage stored in the capacitor Cst to be described below).

The second transistor T2 (or switching transistor) may include a first electrode connected to a data line (or receiving data signal DATA), a second electrode connected to the first node N1, and a gate electrode connected to a first scan line (for example, the first scan line SL1 shown in FIG. 1) or receiving a first scan signal GW. The second transistor T2 may be turned on in response to the first scan signal GW, and may transmit the data signal DATA to the first node N1.

The third transistor T3 may include a first electrode connected to the second node N2, a second electrode connected to the third node N3, and a gate electrode connected to a first scan line or receiving a first scan signal GW. The third transistor T3 may be turned on in response to the first scan signal GW, and may transmit the data signal DATA to the third node N3.

The capacitor Cst may be connected or formed between the third node N3 and the first power supply voltage ELVDD. The capacitor Cst may store or maintain the provided data signal DATA.

The fourth transistor T4 may include a first electrode connected to the third node N3, a second electrode connected to the initialization voltage wiring or receiving the initialization voltage VINT, and a gate electrode connected to a second scan line (for example, the second scan line SL21 shown in FIG. 1) or receiving a second scan signal GI.

The fourth transistor T4 may be turned on in response to the second scan signal GI before the data signal DATA is stored in the capacitor Cst (or after the light emitting element EL emits light), and may initialize the third node N3 (or the capacitor Cst) using the initialization voltage VINT.

In an embodiment, the third and fourth transistors T3 and T4 may be implemented as dual transistors (that is, a transistor assembly in the form of a combination of two transistors). In this case, a leakage current of the third and fourth transistors T3 and T4 and deterioration of display quality due to the leakage current can be prevented or alleviated.

The fifth transistor T5 and the sixth transistor T6 (or first and second light emission control transistors) may be connected between the first power supply voltage wiring and the light emitting element EL, and may form a current route through which a driving current Id generated by the first transistor T1 moves.

The fifth transistor T5 may include a first electrode connected to the first power supply voltage wiring to receive the first power supply voltage ELVDD, a second electrode connected to the first node N1, and a gate electrode connected to a light emission control signal line (for example, the first light emission control signal line shown in FIG. 1) or receiving a light emission control signal EM.

Similarly, the sixth transistor T6 may include a first electrode connected to the second node N2, a second electrode connected to the fourth node N4 (or a pixel electrode of the light emitting element EL), and a gate electrode connected to a light emission control signal line (for example, the first light emission control signal line shown in FIG. 1) or receiving a light emission control signal EM.

The fifth and sixth transistors T5 and T6 may be turned on in response to the light emitting control signal EM. In this case, a driving current Id may be provided to the light emitting element EL, and the light emitting element EL may emit light with luminance corresponding to the driving current Id.

The seventh transistor T7 may include a first electrode connected to the fourth node N4, a second electrode connected to the initialization voltage wiring (or initialization voltage VINT), and a gate electrode connected to the second scan signal line (for example, the second scan signal line SL21 shown in FIG. 1) or receiving the second scan signal GI.

The seventh transistor T7 may be turned on in response to the second scan signal GI before the light emitting element EL emits light (or after the light emitting element EL emits light), and may initialize the pixel electrode of the light emitting element EL using the initialization voltage VINIT. The light emitting element EL may have a parasitic capacitor between the pixel electrode and the cathode electrode (or the second power supply voltage ELVSS). The parasitic capacitor may be charged while the light emitting element EL emits light, so as to allow the pixel electrode of the light emitting element EL to have a specific voltage. Therefore, the light emitting element may be initialized by the seventh transistor T7.

Although it is shown in FIG. 2 that the seventh transistor T7 receives the second scan signal GI, the seventh transistor T7 may receive a third scan signal such as a second scan signal GW[n+1] at (n+1)th time instead of a second scan signal GW[n] at n-th time.

Figure 3:
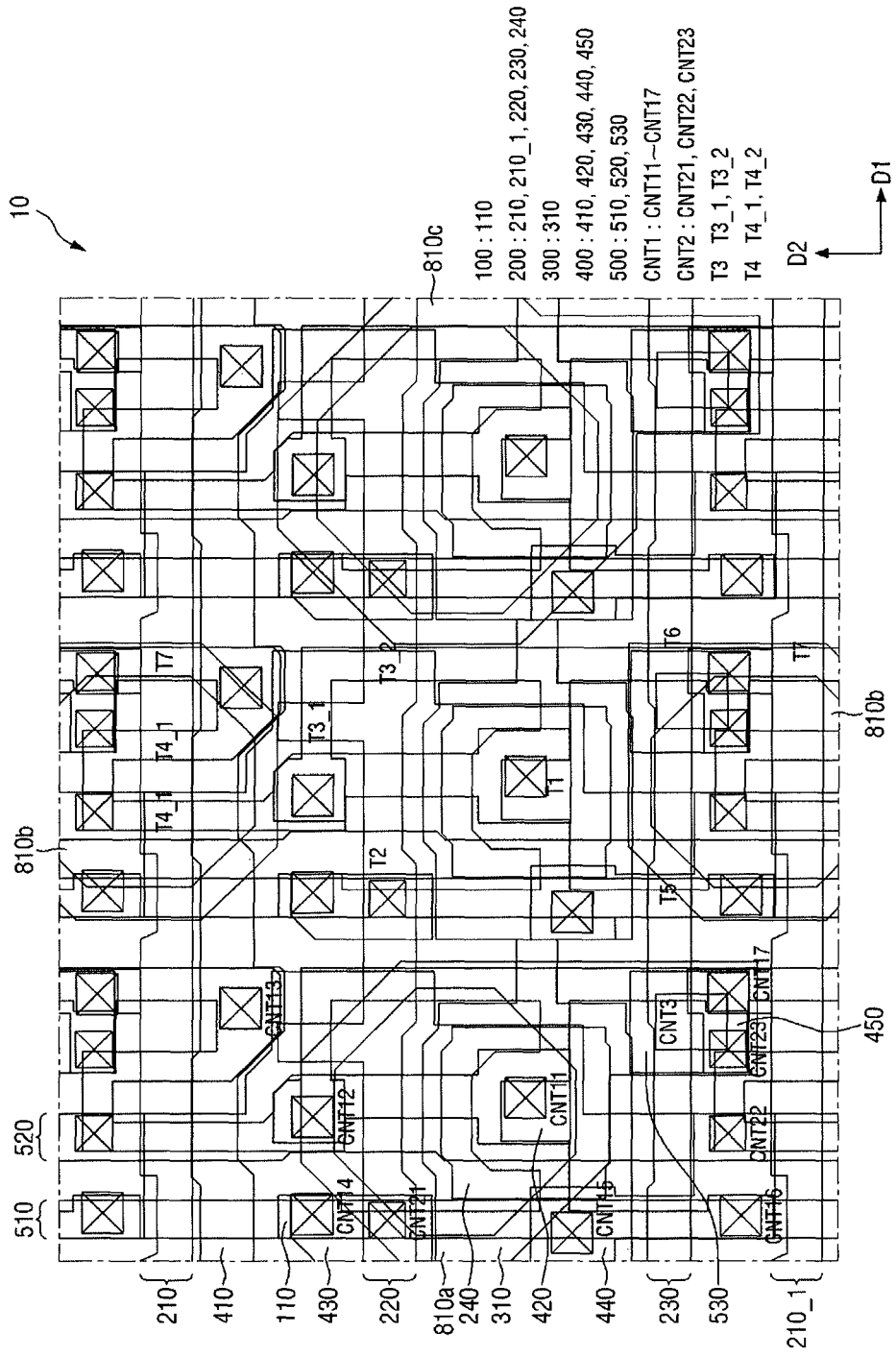
FIGS. 3 and 4 illustrate layout views showing an example of the display device of FIG. 1.
Figure 4:
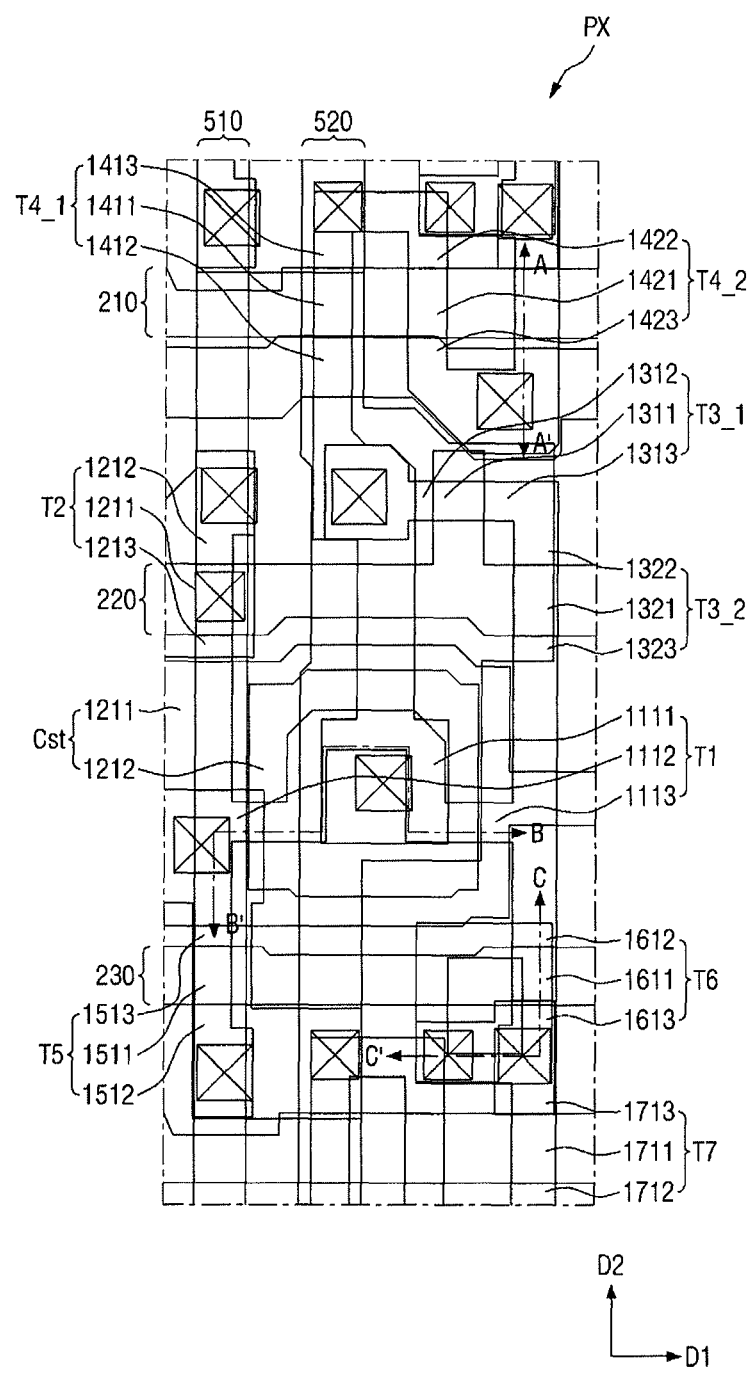
Figure 5:
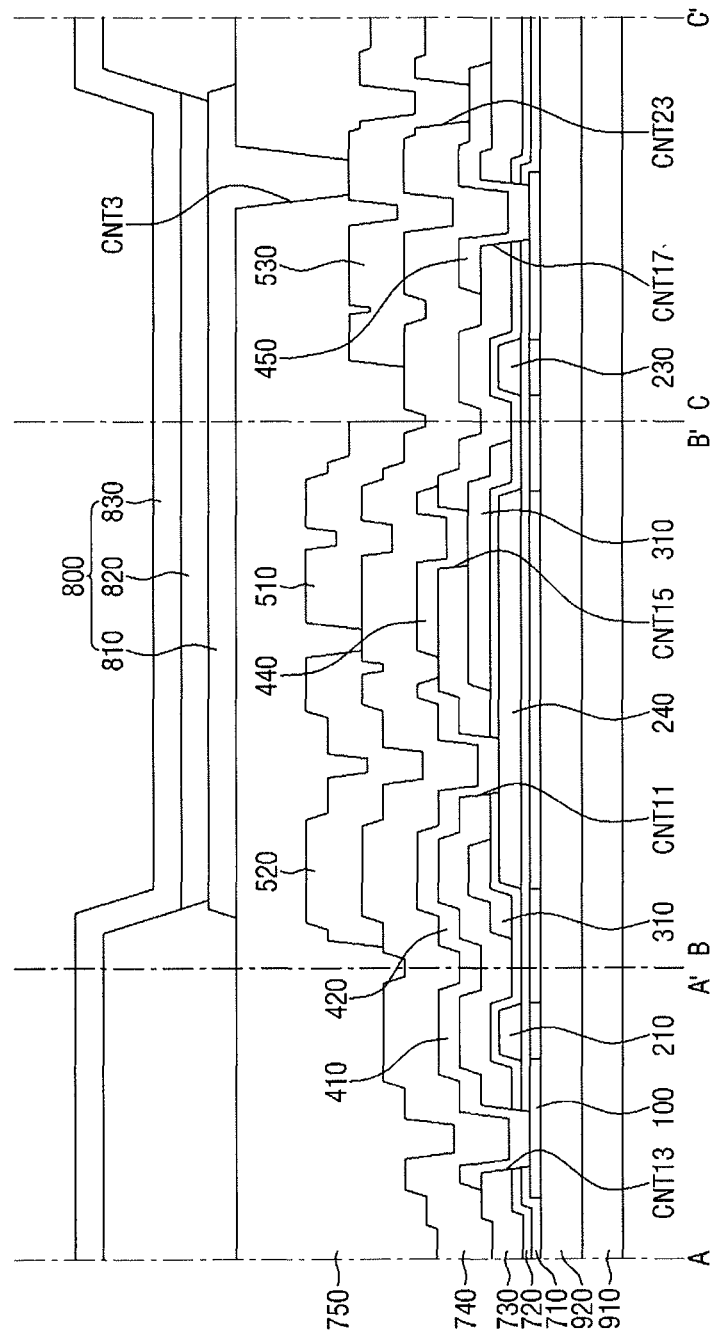
FIG. 5 illustrates a cross-sectional view taken along the lines A-A', B-B', and C-C' in FIG. 4.
Figure 6:
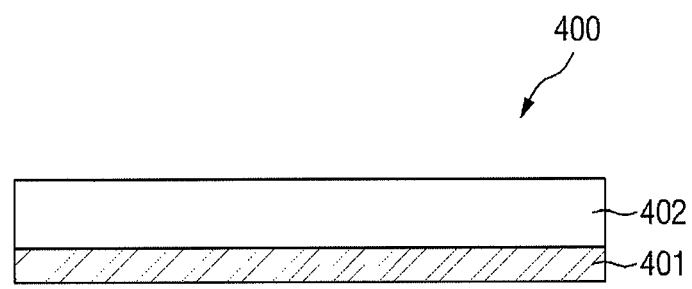
FIG. 6 illustrates a cross-sectional view showing an example of a second conductive layer included in the display device of FIG. 5.

FIGS. 3 and 4 are layout views showing an example of the display device of FIG. 1. FIG. 5 is a cross-sectional view taken along the lines A-A', B-B', and C-C' in FIG. 4. FIG. 6 is a cross-sectional view showing an example of a second conductive layer included in the display device of FIG. 5.

In the following example embodiments, although some components are substantially the same as the components mentioned in FIGS. 1 and 2, new reference numerals will be given to facilitate the description of an arrangement and coupling relationship among the elements.

Referring to FIGS. 2 to 6, the pixel PX may include first to seventh transistors T1 to T7, a storage capacitor Cst, and a light emitting element EL.

The first to seventh transistors T1 to T7 may include a conductive layer forming an electrode, a semiconductor layer forming a channel, and an insulating layer. Top gate type transistors (where a gate electrode is disposed above a semiconductor layer) may be used as the first to seventh transistors T1 to T7.

The display device 1 (or the display unit 10) may include a substrate 910, a buffer layer 920, a semiconductor layer 100, a first insulating layer 710, a first conductive layer 200, a second insulating layer 720, a second conductive layer 300, a third insulating layer 730, a third conductive layer 400, a fourth insulating layer 740, a fourth conductive layer 500, and a fifth insulating layer 750. The substrate 910, the buffer layer 920, the semiconductor layer 100, the first insulating layer 710, the first conductive layer 200, the second insulating layer 720, the second conductive layer 300, the third insulating layer 730, the third conductive layer 400, the fourth insulating layer 740, the fourth conductive layer 500, and the fifth insulating layer 750 may be sequentially disposed and laminated. The display device 1 may further include a display element layer and an encapsulation layer.

Each of the aforementioned layers may be formed of a single film, but may also be formed of a laminate film including a plurality of films. Another layer may be further disposed between the respective layers.

The substrate 910 supports the layers disposed thereon. When the display device 1 is a back-sided or double-sided light emission type, a transparent substrate may be used as the substrate 910. When the display device 1 is a front-sided light emission type, a translucent or opaque substrate as well as a transparent substrate may be used as the substrate 910.

The substrate 910 may be formed of an insulating material such as glass, quartz, or a polymer resin. Examples of the polymer resin include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and combinations thereof. The substrate 910 may include a metal material.

The substrate 910 may be a rigid substrate or a flexible substrate capable of bending, folding, rolling, or the like. An example of the material constituting the flexible substrate 910 is polyimide (PI).

The buffer layer 920 may be on the entire surface of the substrate 910. The buffer layer 920 may prevent the diffusion of impurity ions, may prevent the penetration of moisture or external air, and may perform a surface planarization function. The buffer layer 920 may include silicon nitride, silicon oxide, or silicon oxynitride. The buffer layer 920 may be omitted depending on the type of the substrate 910, process conditions, and the like.

The semiconductor layer 100 is an active layer and may form a channel of the first to seventh transistors T1 to T7.

The semiconductor layer 100 may be separated from each other for each pixel, or, for example, as shown in FIG. 3, the pixels arranged in the second direction D2 (or the column direction) may share the semiconductor layer 100.

The semiconductor layer 100 may include a horizontal portion extending substantially in the first direction D1, a first vertical portion (or left vertical portion) and a second vertical portion (or right vertical portion) extending substantially in the second direction D2, and a curved portion extending in a zigzag form.

The horizontal portion may connect an intermediate portion of the first vertical portion and an intermediate portion of the second vertical portion. The horizontal portion may connect the first vertical portion and the second vertical portion at the shortest distance, but may include a left bent portion and a right bent portion as shown in FIG. 4. The total length of the horizontal portion may be increased by bending the horizontal portion a plurality of times. The horizontal portion may be provided with a channel 1111 of the first transistor T1.

The first vertical portion may be disposed adjacent to the left side of the pixel PX (or an pixel area where one pixel PX is disposed), and the second vertical portion may be disposed adjacent to the right side of the pixel PX. The first vertical portion and the second vertical portion may be spaced apart from each other. The length of the second vertical portion in the column direction may be longer than the length of the first vertical portion in the column direction.

A channel 1211 of the second transistor T2 may be disposed in the upper portion of the first vertical portion, and a channel 1511 of the fifth transistor T5 may be disposed in the lower portion of the second vertical portion. A channel 1321 of the 32nd sub-transistor T3_2 may be disposed in the upper portion of the second vertical portion, and a channel 1611 of the sixth transistor T6 and a channel 1711 of the seventh transistor T7 may be disposed in the lower portion of the second vertical portion.

The curved portion may include a first sub-curved portion extending from the upper end of the first vertical portion to the left side thereof, a second sub-curved portion bending and extending to the upper side of the first vertical portion, and a third sub-curved portion bending and extending the left and upper sides of the first vertical portion, and may connected to the second vertical portion (or the second vertical portion located in the previous pixel area). The first sub-curved portion may be provided with a channel 1311 of a 31st transistor T3_1, the second sub-curved portion may be provided with a channel 1411 of a 41st transistor T4_1, and the third sub-curved portion may be provided with a channel 1421 of a 42nd transistor T4_2. The 31st transistor T3_1 and a 32nd transistor T3_2 may be included in the third transistor T3, and the 41st transistor T4_1 and a 42nd transistor T4_2 may be included in the fourth transistor T4.

The semiconductor layer 100 may include polycrystalline silicon. The polycrystalline silicon may be formed by crystallizing amorphous silicon. Examples of the crystallization method include rapid thermal annealing (RTA), solid phase crystallization (SPC), excimer laser annealing (ELA), metal induced crystallization (MIC), metal induced lateral crystallization (MILC), sequential lateral solidification (SLS), etc. In an embodiment, the semiconductor layer 100 may include single crystal silicon, low-temperature polycrystalline silicon, amorphous silicon, or the like.

In the semiconductor layer 100, the regions (for example, electrode regions or source/drain regions) connected to the source/drain electrodes of each of the first to seventh transistors T1 to T7 may be doped with impurity ions. A trivalent dopant such as boron (B) may be used as p-type impurity ions.

The first insulating layer 710 may be on the semiconductor layer 100, and may be disposed substantially over the entire surface of the substrate 910. The first insulating layer 710 may be a gate insulating film having a gate insulating function.

The first insulating layer 710 may include a silicon compound or a metal oxide. For example, the first insulating layer 710 may include silicon oxide, silicon nitride, silicon oxynitride, aluminum oxide, tantalum oxide, hafnium oxide, zirconium oxide, or titanium oxide. These compounds may be used alone or as a combination of two or more. The first insulating layer 710 may be a single film or a multilayer film formed of a laminate film of different materials. For example, the first insulating layer 710 may include silicon nitride (SiNx) and silicon dioxide ($SiO_2$), and may be formed by chemical vapor deposition (CVD) using silane gas ($SiH_4$).

The first conductive layer 200 is on the first insulating layer 710. The first conductive layer 200 may include a first scan line 210, a second scan line 220, a light emission control line 230, and a first gate electrode 240.

The first scan line 210 may transmit a second scan signal GI. The first scan line 210 may extend along the second direction D2, and may extend to the neighboring pixel beyond the boundary of the pixel PX.

The first scan line 210 may be located above the pixel PX in a plan view. The first scan line 210 may overlap the curved portion of the semiconductor layer 100. A gate electrode of the 41st transistor T4_1 may be formed in a 41st overlap area where the first scan line 210 overlaps the second sub-curved portion of the semiconductor layer 100, and a gate electrode of the 42nd transistor T4_2 may be formed in a 42nd overlap area where the first scan line 210 overlaps the third sub-curved portion of the semiconductor layer 100. A portion 1412 of the semiconductor layer 100, located below the 41st overlap area, may be formed into a first electrode area (or an area where a first electrode is formed) of the 41st transistor T4_1, and a portion 1413 of the semiconductor layer 100, located above the 41st overlap area, may be formed into a second electrode area of the 41st transistor T4_1. Similarly, a portion 1422 of the semiconductor layer 100, located above the 42nd overlap area, may be formed into a first electrode area of the 42nd transistor T4_2, and a portion 1423 of the semiconductor layer 100, located below the 42nd overlap area, may be formed into a second electrode area of the 42nd transistor T4_2.

The first scan line 210 may overlap the lower side of the second vertical portion of the semiconductor layer 100. A gate electrode of the seventh transistor T7 may be formed in a seventh overlap area where the first scan line 210 overlaps the second vertical portion of the semiconductor layer 100. A portion 1712 of the semiconductor layer 100, located below the seventh overlap area, may be formed into a first electrode area of the seventh transistor T7, and a portion 1713 of the semiconductor layer 100, located above the seventh overlap area, may be formed into a second electrode area of the seventh transistor T7.

The second scan line 220 may transmit a first scan signal GW. The second scan line 220 may extend along the second direction D2, and may extend to the neighboring pixel beyond the boundary of the pixel PX.

The second scan line 220 may be located at the middle of the pixel PX in a plan view. The second scan line 220 may overlap the upper side of the first vertical portion, the first sub-curved portion, and the upper side of the second vertical portion of the semiconductor layer 100. As shown in FIG. 4, the second scan line 220 may include a protrusion protruding in the first direction D1, and the protrusion may overlap the first sub-curved portion of the semiconductor layer 100.

A gate electrode of the second transistor T2 may be formed in a second overlap area where the second scan line 220 overlaps the first vertical portion of the semiconductor layer 100. A portion 1212 of the semiconductor layer 100, located above the second overlap area, may be formed into a first electrode area of the second transistor T2, and a portion 1213 of the semiconductor layer 100, located below the second overlap area, may be formed into a second electrode area of the second transistor T2.

A gate electrode of the 31st transistor T3_1 may be formed in a 31st overlap area where the second scan line 220 overlaps the first sub-curved portion of the semiconductor layer 100. A portion 1312 of the semiconductor layer 100, located left the 31st overlap area, may be formed into a first electrode area of the 31st transistor T3_1, and a portion 1313 of the semiconductor layer 100, located right the 31st overlap area, may be formed into a second electrode area of the 31st transistor T3_1.

A gate electrode of the 32nd transistor T3_2 may be formed in a 32nd overlap area where the second scan line 220 overlaps the first vertical portion of the semiconductor layer 100. A portion 1322 of the semiconductor layer 100, located above the 32nd overlap area, may be formed into a first electrode area of the 32nd transistor T3_2, and a portion 1323 of the semiconductor layer 100, located below the 32nd overlap area, may be formed into a second electrode area of the 32nd transistor T3_2.

The light emission control line 230 may transmit a light emission control signal EM. The light emission control line 230 may extend along the second direction D2, and may extend to the neighboring pixel beyond the boundary of the pixel PX.

The light emission control line 230 may be located below the pixel PX in a plan view. The light emission control line 230 may overlap the lower side of the first vertical portion of the semiconductor layer 100 and the lower side of the second vertical portion thereof.

A gate electrode of the fifth transistor T5 may be formed in a fifth overlap area where the light emission control line 230 overlaps the first vertical portion of the semiconductor layer 100. A portion 1512 of the semiconductor layer 100, located below the fifth overlap area, may be formed into a first electrode area of the fifth transistor T5, and a portion 1513 of the semiconductor layer 100, located above the fifth overlap area, may be formed into a second electrode area of the fifth transistor T5.

Similarly, a gate electrode of the sixth transistor T6 may be formed in a sixth overlap area where the light emission control line 230 overlaps the second vertical portion of the semiconductor layer 100. A portion 1612 of the semiconductor layer 100, located above the sixth overlap area, may be formed into a first electrode area of the sixth transistor T6, and a portion 1613 of the semiconductor layer 100, located below the sixth overlap area, may be formed into a second electrode area of the sixth transistor T6.

The first gate electrode 240 is a gate electrode of the first transistor, and may be located at the center of the pixel. The first gate electrode 240 may be disposed between the second scan line 220 and the light emission control line 230 in a plan view. The first gate electrode 240 may be separated for each pixel, and may be disposed in an island shape.

The first gate electrode 240 may overlap the horizontal portion of the semiconductor layer 100. A portion 1112 of the semiconductor layer 100, located left the first overlap area where the first gate electrode 240 overlaps the horizontal portion of the semiconductor layer 100, may be formed into a first electrode area of the first transistor T1, and a portion 1113 of the semiconductor layer 100, located right the first overlap area, may be formed into a second electrode area of the first transistor T1.

The first conductive layers 200 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir) (Cr), calcium (Ca), titanium (Ti), tantalum (Ta), tungsten (W), or copper (Cu). The first conductive layers 200 may be a single-layer film or a multi-layer film.

The second insulating layer 720 may be on the first conductive layer 200, and may be disposed over the entire surface of the substrate 910. The second insulating layer 720 may serve to insulate the first conductive layer 200 and the second conductive layer 300, and may be an interlayer insulating film.

The second insulating layer 720 may include an inorganic insulating material such as silicon oxide, silicon nitride, silicon oxynitride, hafnium oxide, aluminum oxide, titanium oxide, tantalum oxide, or zinc oxide, or may include an organic insulating material such as polyacrylate resin, epoxy resin, polyimide resin, unsaturated polyester resin, polyphenylene ether resin, polyphenylene sulfide resin, or benzocyclobutene (BCB). The second insulating layer 720 may be a single-layer film or a multilayer film formed of a laminate film of different materials.

The second conductive layer 300 is on the second insulating layer 720. The second conductive layer 300 may include an electrode line 310 of the storage capacitor Cst.

The electrode line 310 of the storage capacitor Cst may traverse the center of the pixel, and may be disposed between the second scan line 220 and the light emission control line 230 in a plan view. The electrode line 310 of the storage capacitor Cst may be disposed to overlap the first gate electrode 240 with the second insulating layer 720 therebetween. The first gate electrode 240 may become a first electrode of the storage capacitor Cst, the extended region of the electrode line 310 of the storage capacitor Cst overlapping therewith may become a second electrode of the storage capacitor Cst, and the second insulating layer 720 interposed therebetween may be a dielectric of the storage capacitor Cst.

The electrode line 310 of the storage capacitor Cst may extend along the second direction D2, and may extend to the neighboring pixel beyond the boundary of the pixel PX. The width of the electrode line 310 of the storage capacitor Cst in the area overlapping the first gate electrode 240 may be extended. The extended area of the electrode line 310 of the storage capacitor Cst may include an opening overlapping a conductive pattern 420 to be described below.

The third insulating layer 730 may be on the second conductive layer 300 to cover the second conductive layers 300. The third insulating layer 730 may include a silicon compound or a metal oxide. For example, the third insulating layer 730 may include silicon oxide, silicon nitride, silicon oxynitride, aluminum oxide, tantalum oxide, hafnium oxide, zirconium oxide, or titanium oxide. They may be used alone or as a combination thereof. The third insulating layer 730 may be a single-layer film or a multi-layer film formed of a laminate film of different materials.

The third insulating layer 730 may include a first contact hole CNT1, and the first contact hole CNT1 may include 11th to 17th contact holes CNT11 to CNT17. The 11th to 17th contact holes CNT11 to CNT17 will be described together with the third conductive layer 400.

The third conductive layer 400 is on the second insulating layer 720. The third conductive layer 400 may include an initialization voltage line 410 for transmitting an initialization voltage VINT, a first conductive pattern 420, a second conductive pattern 430, a third conductive pattern 440, and a fourth conductive pattern 450.

The initialization voltage line 410 may be disposed between the first scan line 210 and the second scan line 220 in a plan view, and may extend to the neighboring pixel beyond the boundary of the pixel along the second direction D2. In an area where the initialization voltage line 410 and the semiconductor layer 100 overlap each other, a 13th contact hole CNT13 penetrating the first to third insulating layers 710, 720, and 730 to expose the semiconductor layer 100 may be formed, and the initialization voltage line 410 may be in contact with the first semiconductor layer 100 through the 13th contact hole CNT13.

The first conductive pattern 420 may be disposed to overlap the first gate electrode 240 and extend in the first direction D1 to overlap the curved portion of the semiconductor layer 100.

In an area where the first conductive pattern 420 and the first gate electrode 240 overlap each other, an 11th contact hole CNT11 penetrating the second and third insulating layers 720 and 730 to expose the first gate electrode 240 may be formed, and the first conductive pattern 420 may be in contact with the first gate electrode 240 through the 11th contact hole CNT11. Similarly, in an area where the first conductive pattern 420 and the curved portion of the semiconductor layer 100 overlap each other, a 12th contact hole CNT12 penetrating the first to third insulating layers 710, 720, and 730 to expose the semiconductor layer 100 may be formed, and the first conductive pattern 420 may be in contact with the first semiconductor layer 100 through the 12th contact hole CNT12. Thus, the first conductive pattern 420 may electrically connect the gate electrode of the first transistor T1 (and the first electrode of the storage capacitor Cst) to the first electrode of the first transistor T1.

The 11th contact hole CNT11 may be formed on the opening of the electrode 310 of the storage capacitor Cst. In the 11th contact hole CNT11, the first conductive pattern 420 and the storage capacitor Cst adjacent thereto may be isolated from each other through the third insulating layer 730.

The second conductive pattern 430 may be disposed to the upper end of the first vertical portion of the semiconductor layer 100. The second conductive pattern 430 may be disposed to overlap a data line 510 to be described below.

In an area where the second conductive pattern 430 overlaps the upper end of the first vertical portion of the semiconductor layer 100, a 14th contact hole CNT14 penetrating the first to third insulating layers 710, 720 and 730 to expose the semiconductor layer 100 may be formed, and the second conductive pattern 430 may be in contact with the semiconductor layer 100 through the 14th contact hole CNT14. The second conductive pattern 430 may be electrically connected to the data line 510 through a 21st contact hole CNT21 to be described below, and the 14th contact hole CNT14 may not overlap the 21st contact hole CNT21.

The third conductive pattern 440 may overlap the first electrode line 310 of the storage capacitor Cst, and may overlap the lower end of the first vertical portion of the semiconductor layer 100. The third conductive pattern 440 may be disposed to overlap a power supply voltage wiring 520 to be described below.

In an area where the third conductive pattern 440 overlaps the first electrode line 310 of the storage capacitor Cst, a 15th contact hole CNT15 penetrating the third insulating layers 730 to expose the first electrode line 310 of the storage capacitor Cst may be formed, and the third conductive pattern 440 may be in contact with the first electrode line 310 of the storage capacitor Cst through the 15th contact hole CNT15.

In an area where the third conductive pattern 440 overlaps the lower end of the first vertical portion of the semiconductor layer 100, a 16th contact hole CNT16 penetrating the first to third insulating layers 710, 720 and 730 to expose the semiconductor layer 100 may be formed, and the third conductive pattern 440 may be in contact with the lower end of the first vertical portion of the semiconductor layer 100 through the 16th contact hole CNT16. The third conductive pattern 440 may be electrically connected to the power supply voltage wiring 520 through a 22nd contact hole CNT22 to be described below. Thus, the third conductive pattern 440 may electrically connect the electrode of the storage capacitor Cst and the first electrode of the fifth transistor T5 to the power supply voltage wiring 520.

The fourth conductive pattern 450 may overlap the lower side of the second vertical portion of the semiconductor layer 100. The fourth conductive pattern 450 may be disposed to overlap a via electrode 530 to be described below.

In an area where the fourth conductive pattern 450 overlaps the lower side of the second vertical portion of the semiconductor layer 100, a 17th contact hole CNT17 penetrating the first to third insulating layers 710, 720 and 730 to expose the semiconductor layer 100 may be formed, and the fourth conductive pattern 450 may be in contact with the lower side of the second vertical portion of the semiconductor layer 100 through the 17th contact hole CNT17. The fourth conductive pattern 450 may be electrically connected to the via electrode 530 through a 23rd contact hole CNT23 to be described below. Thus, the fourth conductive pattern 450 may electrically connect the second electrode of the sixth transistor T6 (and the second electrode of the seventh transistor T7 to the first electrode of the light emitting element EL.

The third conductive layer 400 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir) (Cr), calcium (Ca), titanium (Ti), tantalum (Ta), tungsten (W), or copper (Cu). The third conductive layer 400 may be a single-layer film or a multi-layer film. For example, the third conductive layer 400 may be formed to have a laminate structure of Ti/Al/Ti, Mo/Al/Mo, Mo/AlGe/Mo, or Ti/Cu.

In an example embodiment, the third conductive layer 400 may include a hydrogen barrier material (or a hydrogen diffusion preventing material) or a hydrogen barrier layer (or a hydrogen diffusion preventing layer). The hydrogen barrier material refers to a material having barrier properties to hydrogen (or hydrogen ion ($H^+$)), and examples thereof include titanium (Ti), tin (Sn), nickel (Ni), and indium oxides such as indium zinc oxide (IZO) and indium tin oxide (ITO). The hydrogen barrier layer refers to a layer through which hydrogen cannot pass or diffuse, and may be a layer including a hydrogen barrier material such as titanium (Ti).

In an example embodiment, the third conductive layer 400 may include an alloy of titanium (Ti) and any one of aluminum (Al) and molybdenum (Mo).

Referring to FIG. 6, the third conductive layer 400 may include a metal conductive layer 401 and a hydrogen barrier layer 402.

The metal conductive layer 401 may be disposed directly on the third insulating layer 730 shown in FIG. 5, and the hydrogen barrier layer 402 may be disposed directly on the metal conductive layer 401. Thus, the hydrogen barrier layer 402 may cover (or cap) the metal conductive layer 401.

The metal conductive layer 401 may include the aforementioned metal, for example, molybdenum (Mo) or aluminum (Al), the hydrogen barrier layer 402 may include titanium (Ti), and the metal conductive layer 401 may have a laminate structure of, for example, Mo/Ti. The metal conductive layer 401 may have a thickness of 2000 Å or more in consideration of signal transmission, and the hydrogen barrier layer 402 may have a thickness of 1000 Å or less.

Although it is illustrated in FIG. 6 that the hydrogen barrier layer 402 is on the metal conductive layer 401, the hydrogen barrier layer 402 may be disposed beneath the metal conductive layer 401 (between the metal conductive layer 401 and the third insulating layer 730). As another example, the third conductive layer 400 may have a laminate structure of Ti/Al/Ti.

Referring to FIGS. 3 to 5 again, the fourth insulating layer 740 may be on the third conductive layer 400, and may be disposed over the entire surface of the substrate 910. The fourth insulating layer 740 may isolate the third conductive layer 400 from the fourth conductive layer 500. The fourth insulating layer 740 may include the same material as the third insulating layer 730, or may include at least one material selected from the materials exemplified as the constituent material of the third insulating layer 730. The fourth insulating layer 740 may be a single-layer film or a multi-layer film formed of a laminate film of different materials.

The fourth insulating layer 740 may include a second contact hole CNT2, and the second contact hole CNT2 may include 21st to 23rd contact holes CNT21 to CNT23. The 21st to 23rd contact holes CNT21 to CNT23 will be described together with the fourth conductive layer 500.

The fourth conductive layer 500 is on the fourth insulating layer 740. The fourth conductive layer 500 may include a data line 510, a power supply voltage wiring 520, and a via electrode 530.

In an embodiment, similarly to the third conductive layer 400, the fourth conductive layer 500 may include a hydrogen barrier material or a hydrogen barrier layer. In this case, the possibility of hydrogen diffusion through the fourth conductive layer 500 and the second contact hole CNT2 may be further reduced.

The data line 510 may be on the left side of the pixel, may extend along the first direction D1, and may extend to neighboring pixel beyond the boundary of the pixel.

The data line 510 may overlap the first vertical portion of the semiconductor layer 100, and may overlap the second conductive pattern 430 and the third conductive pattern 440.

In an area where the data line 510 overlaps the second conductive pattern 430, a 21st contact hole CNT21 penetrating the fourth insulating layer 740 to expose the second conductive pattern 430 may be formed, and the data line 510 may be connected to the second conductive pattern 430 through the 21st contact hole CNT21.

In an embodiment, the 21st contact hole CNT21 may be disposed to be spaced apart from the 14th contact hole CNT14 by a reference distance without overlapping the 14th contact hole CNT14. The reference distance may be a distance restricting the diffusion of hydrogen through the third conductive layer 400. The reference distance may be equal to or greater than the distance (or pitch) between wirings (for example, between the data line 510 and the power supply voltage wiring). For example, the reference distance may be 2 μm to 6 μm or 3 μm to 4 μm.

As shown in FIGS. 3 and 4, the 21st contact hole CNT21 may be disposed below the 14th contact hole CNT14.

The power supply voltage wiring 520 may be disposed at the center of the pixel, may extend along the first direction D1, and may extend to the neighboring pixel beyond the boundary of the pixel. The power supply voltage wiring 520 may overlap the third transistor T3 (or the 31st and 33rd transistors T3_1 and T3_2), and the width of the power supply voltage wiring 520 may be relatively widened in the corresponding overlap area.

The power supply voltage wiring 520 may overlap the second sub-curved portion of the semiconductor layer 100. In an area where the power supply voltage wiring 520 overlaps the second sub-curved portion of the semiconductor layer 100, a 22nd contact hole CNT22 penetrating the fourth insulating layer 740 to expose the third conductive pattern 440 may be formed, and the power supply voltage wiring 520 may be connected to the third conductive pattern 440 through the 22nd contact hole CNT22.

In an embodiment, the 22nd contact hole CNT22 may be disposed to be spaced apart from the 15th and 16th contact holes CNT15 and CNT16 by a reference distance without overlapping the 15th and 16th contact holes CNT15 and CNT16.

Although it is shown in FIGS. 3 and 4 that the 22nd contact hole CNT22 is located relatively adjacent to the 16th contact hole CNT16, the 22nd contact hole CNT22 may be spaced apart from the 15th and 16th contact holes CNT15 and CNT16 by the same distance. As another example, the 22nd contact hole CNT22 may be located relatively adjacent to the 15th contact hole CNT15 (for example, adjacent to the first transistor T1).

The via electrode 530 may overlap the fourth conductive pattern 450. In an area where the via electrode 530 overlaps the fourth conductive pattern 450, a 23rd contact hole CNT23 penetrating the fourth insulating layer 740 to expose the fourth conductive pattern 450 may be formed, and the via electrode 530 may be connected to the fourth conductive pattern 450 through the 23rd contact hole CNT23.

In an embodiment, the 23rd contact hole CNT23 may be disposed to be spaced apart from the 17th contact hole 17 by a reference distance without overlapping the 17th contact hole 17.

The fourth conductive layer 500 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir) (Cr), calcium (Ca), titanium (Ti), tantalum (Ta), tungsten (W), or copper (Cu). The fourth conductive layer 500 may be a single-layer film or a multi-layer film. For example, the fourth conductive layer 500 may be formed to have a laminate structure of Ti/Al/Ti, Mo/Al/Mo, Mo/AlGe/Mo, or Ti/Cu.

The fifth insulating layer 750 (or a protective film) may be on the fourth conductive layer 500, and may be disposed over the entire surface of the substrate 910. The fifth insulating layer 750 may isolate the fourth conductive layer 500 from the light emitting element EL. The fifth insulating layer 750 may include an organic insulating material such as polyacrylic resin or polyimide resin. The upper surface of the fifth insulating layer 750 may be substantially flat.

The display element layer 800 may be on the fifth insulating layer 750. The display element layer 800 may include a first electrode layer 810, a pixel defining layer PDL, a light emitting layer 820, and a second electrode layer 830.

The first electrode layer 810 may be on the fifth insulating layer 750, and may include a pixel electrode (or an anode electrode) of the light emitting element EL. The pixel electrode may overlap the via electrode 530.

The pixel electrodes may be arranged in, for example, a pentile matrix structure. For example, the pixel electrode 810a of the red pixel R and the pixel electrode 810c of the blue pixel B may be alternately arranged in the second direction D2, the pixel electrode 810a of the red pixel R and the pixel electrode 810b of the green pixel G may be alternately arranged in one diagonal direction, and the pixel electrode 810c of the blue pixel B and the pixel electrode 810b of the green pixel G may be alternately arranged in the other diagonal direction. In other implementations, the arrangement structure of the pixel electrodes 810a, 810b, and 810c may be variously changed.

In an area where the pixel electrode overlaps the via electrode 530, a via hole CNT3 penetrating the fifth insulating layer 750 to expose the via electrode 530 may be formed, and the pixel electrode may be connected to the via electrode 530 through the via hole CNT3.

The pixel electrode may be disposed to overlap the third and fourth transistors T3 and T4. In this case, the pixel electrode may block the inflow of external light from above the third and fourth transistors T3 and T4.

The pixel defining layer PDL may be disposed along the edge of the pixel electrode. The pixel defining layer PDL may include an opening exposing the pixel electrode in an area overlapping the pixel electrode.

The light emitting layer 820 may be on the first electrode layer 810. The light emitting layer 820 may be located in the opening of the pixel defining layer PDL. The light emitting layer 820 may include an organic light emitting material or an inorganic light emitting material.

The second electrode layer 830 may be on the light emitting layer 820. The second electrode layer 830 is a common electrode, and the common electrode may be formed on the pixel defining layer PDL to extend over the plurality of pixels.

The cathode electrode of the first electrode layer, the light emitting layer 820, and the common electrode of the second electrode layer 830 may constitute a light emitting element EL.

An encapsulation layer (or a thin film encapsulation layer) may be on the display element layer 800. The encapsulation layer may prevent moisture and air introduced from the outside from penetrating the light emitting element EL. The encapsulation layer may be a thin film encapsulation layer, and may include at least one organic film and at least one inorganic film. For example, the organic film may include any one selected from epoxy, acrylate, or urethane acrylate, and the inorganic film may include at least one selected from silicon oxide (SiOx), silicon nitride (SiNx), or silicon oxynitride (SiONx).

As described with reference to FIGS. 3 to 6, the display device 1 (or the display unit 10) includes the third conductive layer 400 including a hydrogen barrier material or caps the metal conductive layer 401 with the hydrogen barrier layer 402, which may help prevent the diffusion of hydrogen into the semiconductor layer 100 through the first contact hole CNT1 (for example, the 13th contact hole CNT13 or the 17th contact hole CNT17) at the time of forming the fourth insulating layer 740, and may reduce variations in electrical characteristics of the transistors T1 to T7 including the semiconductor layer 100.

In an example embodiment of the display device 1, the second contact hole CNT2 (for example, the 23rd contact hole CNT23) is spaced apart from the first contact hole CNT1 (for example, the 17th contact hole CNT17). Thus, the first to third conductive patterns 420, 430, and 440 may be configured in the form of a bridge. Such a structure may remove a hydrogen diffusion path for the semiconductor layer 100 and help reduce variations in electrical characteristics of the transistors T1 to T7.

Figure 7:
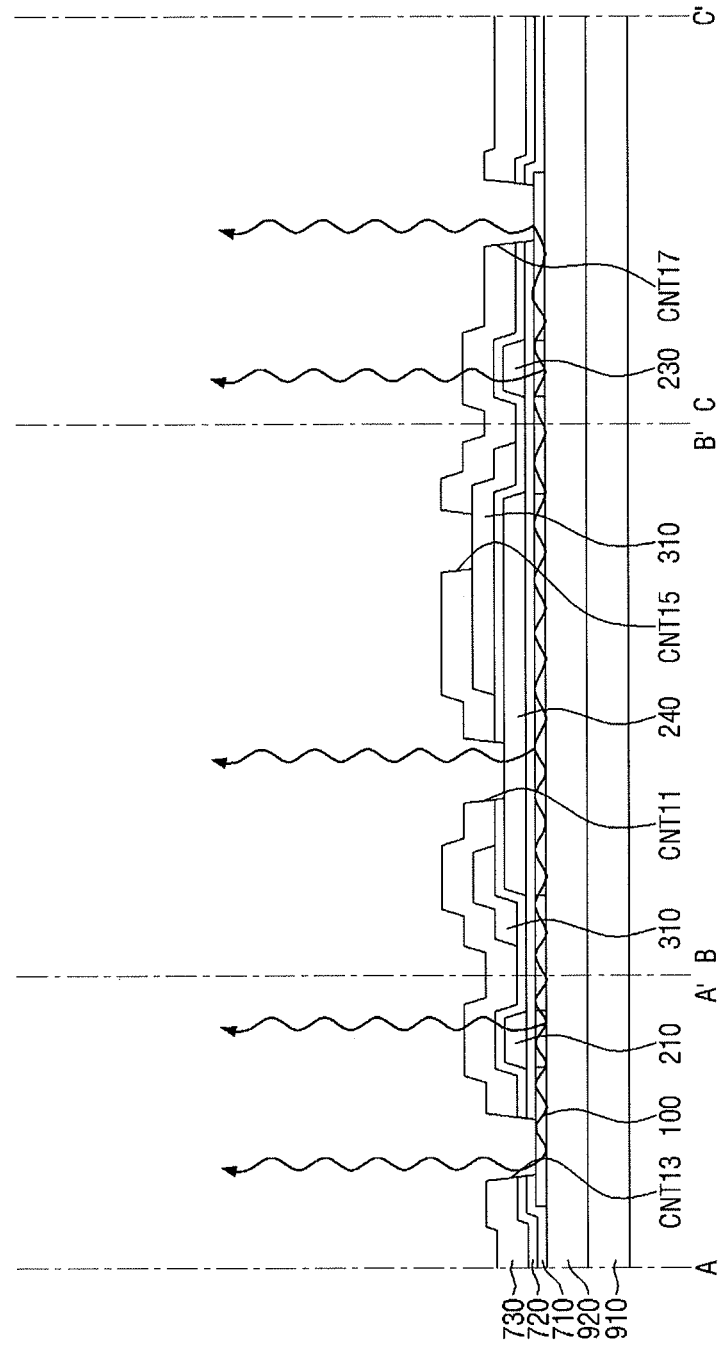
FIGS. 7 and 8 illustrate cross-sectional views for explaining the hydrogenation and dehydrogenation of a semiconductor layer included in the display device of FIG. 5.
Figure 8:
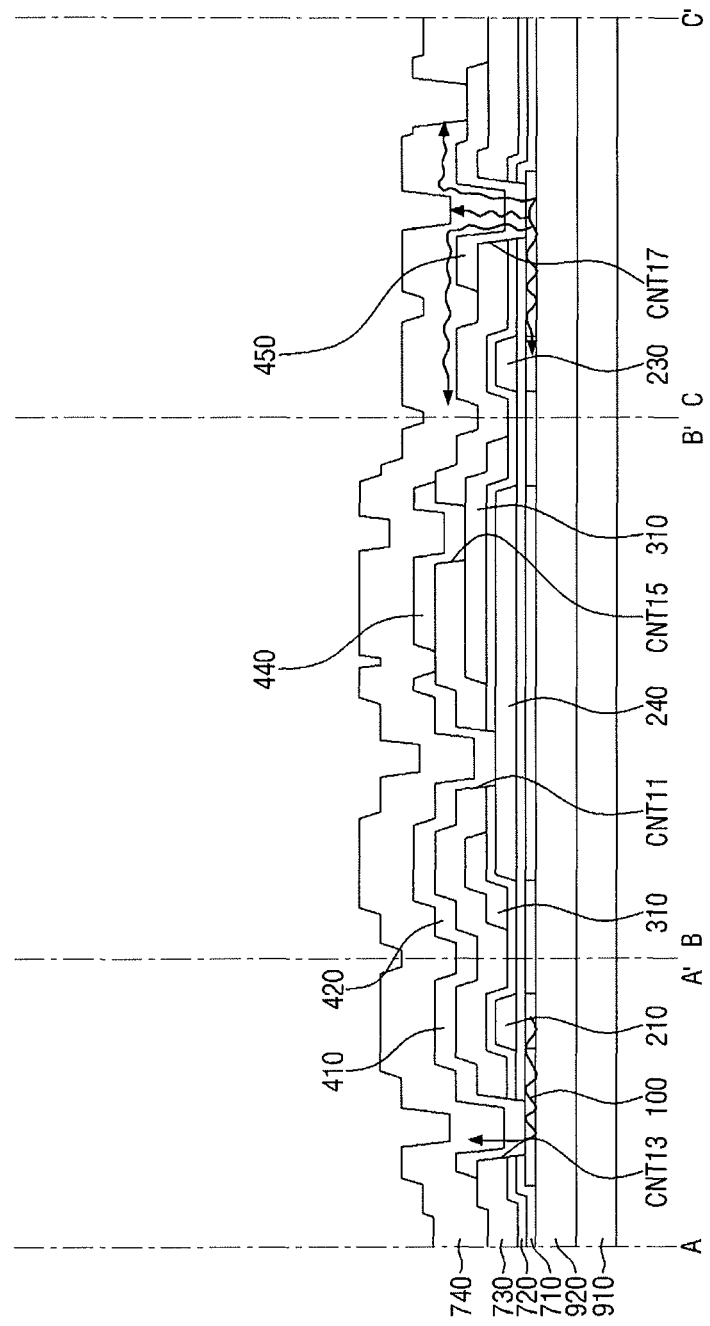

FIGS. 7 and 8 are cross-sectional views for explaining the hydrogenation and dehydrogenation of a semiconductor layer included in the display device of FIG. 5. FIGS. 7 and 8 are cross-sectional views of the display device 1 corresponding to FIG. 5.

First, referring to FIG. 7, the semiconductor layer 100, the first insulating layer 710, the first conductive layer 200, the second insulating layer 720, the second conductive layer 300, and the third insulating layer 730 may be sequentially laminated.

As described above, the first insulating layer 710 may include silicon nitride (SiNx) and silicon dioxide (SiO$_2$), and may be formed by chemical vapor deposition (CVD) using silane gas (SiH$_4$). In this case, the semiconductor layer 100 including a silicon semiconductor may be hydrogenated by a chemical reaction with silane gas.

Then, the 13th contact hole CNT13 and 17th contact hole CNT17 (and the 12th contact hole CNT12, the fourteenth contact hole CNT14, and the 16th contact hole CNT16) penetrating the first to third insulating layers 710 to 730 to expose the semiconductor layer 100 may be formed, and the 11th contact hole CNT11 penetrating the second and third insulating layers 720 and 730 to expose the first conductive layer 200 may be formed.

After forming the 11th, 13th, and 17th contact holes CNT11, CNT13, and CNT17, an annealing process may be performed, and the semiconductor layer 100 may be dehydrogenated during the annealing process. As shown in FIG. 7, most of reduced hydrogen may go out through the 13th and 17th contact holes CNT13 and CNT17, and a part of reduced hydrogen may go out through the first conductive layer 200 (for example, the first scan line 210, the first gate electrode 240, and the 11th contact hole CNT11).

When the conditions of the annealing process are controlled, the degree of hydrogenation of the semiconductor layer 100 can be controlled, and the electrical characteristics (for example, a driving range) of the transistors T1 to T7 can be controlled, if desired.

After the annealing process, the third conductive layer 400 may be formed on the third insulating layer 730, and the fourth insulating layer 740 may be formed on the third conductive layer 400. Similarly to the first insulating layer 710, the fourth insulating layer 740 may include silicon nitride (SiNx) and silicon dioxide (SiO$_2$), and may be formed by a chemical vapor deposition (CVD) technique using silane gas. In this case, the hydrogen component in silane gas may be diffused to the semiconductor layer 100 through the 13th and 17th contact holes CNT13 and CNT 17 (or through the third conductive layer 400), and thus the semiconductor layer 100 may be hydrogenated again.

Then, the second contact hole CNT2 described with reference to FIG. 5 (that is, the 21st to 23rd contact holes CNT21 to CNT 23) may be formed, and the annealing process may be performed, thereby performing the dehydrogenation of the semiconductor layer 100. However, depending on the position of the second contact hole CNT2 and the number of second contact holes CNT2, the dehydrogenation of the entire semiconductor layer 100 may be difficult, and it may be difficult to uniformly control the degree of hydrogenation of the transistors T1 to T7.

Therefore, in the display device 1, the third conductive layer 400 (that is, the third conductive layer 400 formed before forming the fourth insulating layer 740) may include a hydrogen barrier material, or the metal conductive layer 401 of the third conductive layer 400 may be capped with the hydrogen barrier layer 402. Therefore, the rehydrogenation of the semiconductor layer 100 may be prevented, and the degree of hydrogenation of the semiconductor layer 100 may be controlled only by the annealing process at the time of forming the first contact hole CNT1.

In Table 1, the driving ranges (DR) of the transistors (that is, transistors T1 to T7) with respect to materials (and laminate structures) included in the third conductive layer 400 are shown. The "before deposition" refers to a transistor (or a semiconductor layer 100) before the fourth insulating layer 740 is formed, and the "after deposition" refers to a transistor after the fourth insulating layer 740 is formed.

TABLE 1

| Class. | Mo | | Ti/Al/Ti | | Mo/Ti | |
|---|---|---|---|---|---|---|
| | Before deposition | After deposition | Before deposition | After deposition | Before deposition | After deposition |
| DR range [V] | 3.41 | 2.65 | 3.23 | 3.35 | 3.34 | 3.40 |

Referring to Table 1, when the third conductive layer 400 has a single-layer structure of molybdenum (Mo), the driving range of a transistor is about 3.4 V before the fourth insulating layer 740 is formed, but the driving range of the transistor is significantly changed to about 2.65 V by the rehydrogenation of the semiconductor layer 100 after the fourth insulating layer 740 is formed.

When the third conductive layer 400 has a laminate structure of Ti/Al/Ti or Mo/Ti, the driving range of a transistor is about 3.2 V to 3.4 V before the fourth insulating layer 740 is formed, and the driving range of the transistor is about 3.3 V to 3.4 V, which was hardly changed, after the fourth insulating layer 740 is formed.

Thus, when the third conductive layer 400 includes a hydrogen barrier material or is capped with the hydrogen barrier layer 402, the electrical characteristics of the transistor may be controlled to a desired level.

The second contact hole CNT2 (that is, the 21st to 23rd CNT21, CNT22, and CNT23) is spaced apart from the adjacent first contact hole CNT1 (that is, the 14th, 16th, and 17th contact holes CNT14, CNT16, and CNT17) by a reference distance, so that a hydrogen diffusion path (or a hydrogenation/dehydrogenation path) may be more reliably removed, the electrical characteristics of the transistor may be easily controlled, the variation of the electrical characteristics of the transistor may be lessened or made more uniform, and the display quality of the display device 1 may be improved.

Figure 9:
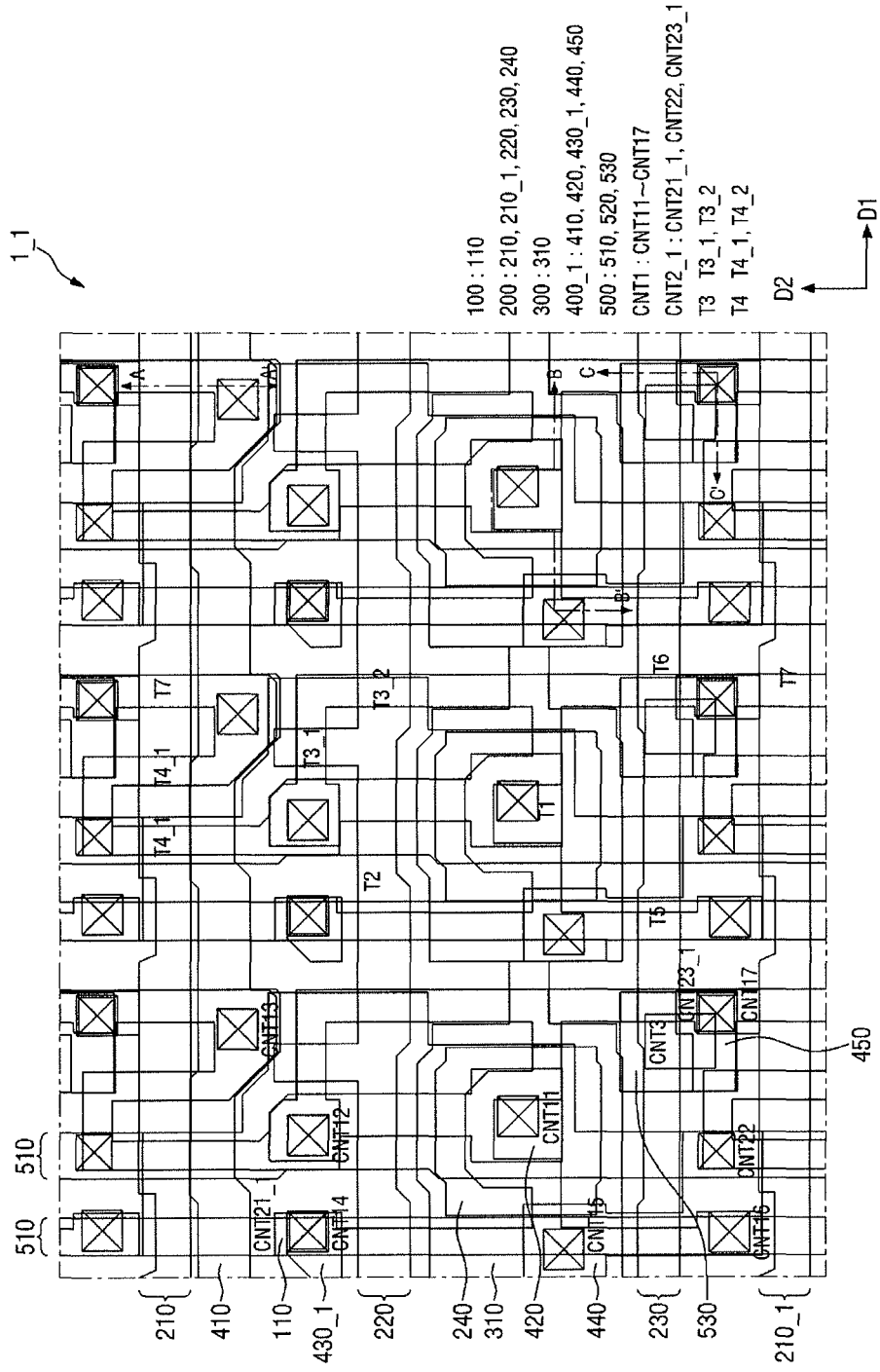
FIG. 9 illustrates a layout view showing another example of the display device of FIG. 1.
Figure 10:
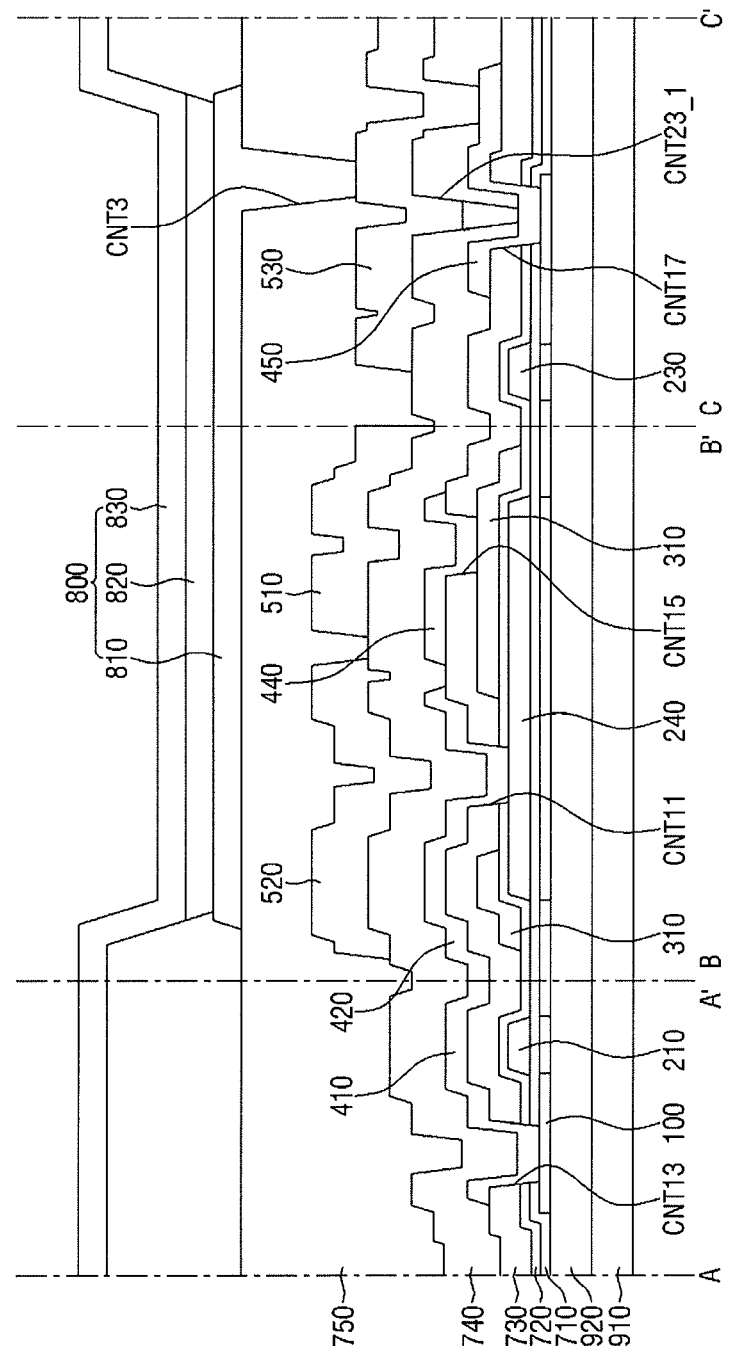
FIG. 10 illustrates a cross-sectional view showing an example of the display device of FIG. 9.

FIG. 9 is a layout view showing another example of the display device of FIG. 1. FIG. 10 is a cross-sectional view showing an example of the display device of FIG. 9. FIG. 10 is a cross-sectional view of the display device 1_1 corresponding to FIG. 5.

Referring to FIGS. 3 to 5, 9, and 10, a display device 1_1 may be substantially the same as or similar to the display device 1 described with reference to FIGS. 3 to 5, except for a third conductive layer 400_1 and a second contact hole CNT2_1. Therefore, a redundant description will not be repeated.

The third conductive layer 400_1 is different from the third conductive layer 400 described with reference to FIGS. 3 to 5 in that it does not include a hydrogen barrier material, and includes the second conductive pattern 430_1.

The third conductive layer 400_1 may not include a hydrogen barrier material, and may include a dehydrogenation material (that is, a hydrogen diffusible material). For example, the third conductive layer 400_1 may not include titanium (Ti), and may have a single-layer structure of molybdenum (Mo).

The second conductive pattern 430_1 may overlap the upper end of the first vertical portion of the semiconductor layer 100, and may not overlap the second scan line 220. Although it is shown in FIGS. 9 and 10 that the second conductive pattern 430_1 has a size smaller than that of the second conductive pattern 430 shown FIGS. 3 to 5, the size may be varied.

A second contact hole CNT2_1 is different from the second contact hole CNT2 described with reference to FIGS. 3 to 5 in that it includes a 21st contact hole CNT21_1 and a 23rd contact hole CNT23_1.

The 23rd contact hole CNT23_1 may be disposed to overlap the 17th contact hole CNT17. Thus, the 17th and 23rd contact holes CNT17 and CNT23_1 may constitute a direct contact hole (direct CNT) connecting the fourth conductive layer 500 and the semiconductor layer 100 on a vertical line (or penetrating the first to fourth insulating layers 710 to 740 in one vertical line. In this case, even when the semiconductor layer 100 is rehydrogenated at the time of forming the third insulating layer 730, the dehydrogenation of the semiconductor layer 100 may be performed through the direct contact hole. Thus, the change in electrical characteristics of the transistor due to the formation of the third insulating layer 730 may be limited.

Similarly, the 21st contact hole CNT21_1 may be disposed to overlap the 14th contact hole CNT14. Thus, the 14th and 21st contact holes CNT14 and CNT21_1 may constitute a direct contact hole (direct CNT) connecting the fourth conductive layer 500 and the semiconductor layer 100 on a vertical line.

As described with reference to FIGS. 9 and 10, the display device 1_1 includes the direct contact hole (direct CNT) connecting the fourth conductive layer 500 and the semiconductor layer 100 on a vertical line, the dehydrogenation of the semiconductor layer 100 can be easily performed, and the changes and variations of electrical characteristics (for example, driving ranges) of the transistor may be reduced.

By way of summation and review, an organic light emitting display device may include a plurality of transistors that provide a driving current to the organic light emitting element. As the resolution of the display device is increased, a pixel area where pixels are formed decreases, and thus the number of layers for disposing circuit elements, wirings, and the like in the pixel area may increase. In the pixel area, signal wirings may be on a transistor, an insulating layer may be interposed between the signal wirings, and the signal wirings may be connected to a semiconductor layer of the transistor through contact holes penetrating the insulating layer. When forming an insulating layer using a chemical vapor deposition technique, a semiconductor layer of a transistor may be hydrogenated by a deposition gas, but may be dehydrogenated by annealing performed after the formation of contact holes, and may again be hydrogenated by the lamination of additional insulating layers, and thus the electrical characteristics of the transistor may be changed.

Embodiments provide a display device that may prevent a change in electrical characteristics of a transistor.

According to an example embodiment, the display device includes a metal conductive layer including a hydrogen barrier material, or includes a metal conductive layer capped with a hydrogen barrier layer, so that the diffusion of hydrogen (or hydrogen ions) into a semiconductor layer through a first contact hole connecting a metal conductive layer to a semiconductor layer located thereunder may be prevented or alleviated, and a variation in electrical characteristics of transistors including the semiconductor layer may be limited.

In a display device according to an embodiment, a second contact hole exposing a conductive layer is spaced apart from the first contact hole. Thus, a hydrogen diffusion path for the semiconductor layer may be removed, and a variation in electrical characteristics of transistors including the semiconductor layer may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
 a substrate;
 a semiconductor layer on the substrate;
 a first insulating layer on the semiconductor layer;
 a first conductive layer on the semiconductor layer;
 a second insulating layer on the first conductive layer;
 a first contact hole penetrating the first insulating layer and the second insulating layer;
 a second conductive layer on the second insulating layer and disposed in the first contact hole so as to be directly connected to the semiconductor layer through the first contact hole, and including a hydrogen barrier material;
 a third insulating layer on the second conductive layer;
 a fourth conductive layer disposed between the second insulating layer and the second conductive layer; and
 a fourth insulating layer disposed between the fourth conductive layer and the second conductive layer.

2. The display device as claimed in claim 1, wherein the third insulating layer includes silicon nitride and silicon dioxide.

3. The display device as claimed in claim 2, wherein the second conductive layer includes at least one of titanium, tin, nickel, indium zinc oxide, or indium tin oxide.

4. The display device as claimed in claim 2, wherein the second conductive layer includes:
 a metal conductive layer on the second insulating layer and connected to the semiconductor layer through the first contact hole; and
 a hydrogen barrier layer on the metal conductive layer and including the hydrogen barrier material.

5. The display device as claimed in claim 2, wherein the second conductive layer includes:
 a first hydrogen barrier layer on the second insulating layer;
 a metal conductive layer on the first hydrogen barrier layer; and
 a second hydrogen barrier layer on the metal conductive layer.

6. The display device as claimed in claim 2, wherein
 the third insulating layer is formed by a chemical vapor deposition technique using silane gas, and
 the second conductive layer prevents hydrogen ions in the silane gas from diffusing into the semiconductor layer.

7. The display device of claim 1, further comprising:
 a second contact hole penetrating the third insulating layer to expose the second conductive layer, the second contact hole not overlapping the first contact hole; and
 a third conductive layer on the third insulating layer and electrically connected to the semiconductor layer through the second contact hole, the second conductive layer, and the first contact hole.

8. The display device as claimed in claim 7, wherein the second contact hole is spaced apart from the first contact hole by 2 μm to 6 μm in a plan view.

9. The display device as claimed in claim 7, wherein the third conductive layer includes the hydrogen barrier material.

10. The display device as claimed in claim 7, wherein:
 the first conductive layer includes a gate electrode of a transistor,
 the second conductive layer includes a first electrode of the transistor, and
 the first electrode of the transistor is connected to the semiconductor layer through the first contact hole.

11. The display device as claimed in claim 10, wherein the third conductive layer includes a signal wiring electrically connected to the first electrode of the transistor through the second contact hole.

12. The display device as claimed in claim 11, wherein the semiconductor layer includes a first portion extending in a first direction, and the signal wiring extends in the first direction and overlaps the first portion of the semiconductor layer.

13. The display device as claimed in claim 10, further comprising:
a display element layer on the fourth insulating layer and including a light emitting element, wherein
the fourth insulating layer is also at least partially disposed on the third conductive layer,
the third conductive layer includes a via electrode electrically connected to the first electrode of the transistor through the second contact hole, and
the light emitting element is electrically connected to the via electrode through a third contact hole penetrating the fourth insulating layer to expose the via electrode.

14. The display device as claimed in claim 10, wherein:
the fourth conductive layer includes a first electrode of a capacitor; and
the second conductive layer further includes a second electrode of the capacitor overlapping the first electrode of the capacitor.

15. The display device as claimed in claim 14, wherein:
the second conductive layer further includes a conductive pattern connecting the first electrode of the transistor to the second electrode of the capacitor, and
the third conductive layer includes a signal wiring electrically connected to the conductive pattern through the second contact hole.

16. A display device, comprising:
a substrate;
a semiconductor layer on the substrate;
a first insulating layer on the semiconductor layer;
a first conductive layer on the semiconductor layer;
a second insulating layer on the first conductive layer;
a first contact hole penetrating the first insulating layer and the second insulating layer to expose the semiconductor layer;
a second conductive layer on the second insulating layer and connected to the semiconductor layer through the first contact hole;
a third insulating layer on the second conductive layer;
a second contact hole penetrating the third insulating layer to expose the second conductive layer and overlapping the first contact hole; and
a third conductive layer on the third insulating layer and connected to the second conductive layer through the second contact hole; wherein
the second contact hole is smaller than the first contact hole.

17. The display device as claimed in claim 16, wherein:
the third insulating layer includes silicon nitride and silicon dioxide, and
each of the second conductive layer and the third conductive layer does not include a hydrogen barrier material.

18. The display device as claimed in claim 17, wherein:
the first conductive layer includes a gate electrode of a transistor,
the second conductive layer includes a first electrode of the transistor, and
the first electrode of the transistor is connected to the semiconductor layer through the first contact hole.

19. The display device as claimed in claim 18, further comprising:
a fourth insulating layer on the third conductive layer; and
a display element layer on the fourth insulating layer and including a light emitting element, wherein
the third conductive layer includes a via electrode electrically connected to the first electrode through the second contact hole, and
the light emitting element is electrically connected to the via electrode through a third contact hole penetrating the fourth insulating layer to expose the via electrode.

20. A display device, comprising:
a substrate;
a semiconductor layer including a first electrode of a transistor on the substrate;
a first insulating layer on the semiconductor layer;
a first conductive layer on the semiconductor layer;
a second insulating layer on the first conductive layer;
a first contact hole penetrating the first insulating layer and the second insulating layer to expose the semiconductor layer;
a second conductive layer on the second insulating layer and connected to the semiconductor layer through the first contact hole;
a third insulating layer on the second conductive layer;
a second contact hole penetrating the third insulating layer to expose the second conductive layer and overlapping the first contact hole, the first contact hole being wider than the second contact hole; and
a third conductive layer on the third insulating layer and connected to the second conductive layer through the second contact hole, wherein
the third conductive layer includes a signal wiring electrically connected to the first electrode of the transistor through the second contact hole.

* * * * *